(12) United States Patent
Moriguchi (10) Patent No.: US 6,176,098 B1
(45) Date of Patent: Jan. 23, 2001

(54) WATER VAPORIZATION TYPE COOLER FOR HEAT-GENERATING ELEMENT

(75) Inventor: Tetsuo Moriguchi, Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/230,319

(22) PCT Filed: Jun. 23, 1997

(86) PCT No.: PCT/JP97/02150

§ 371 Date: Jan. 22, 1999

§ 102(e) Date: Jan. 22, 1999

(87) PCT Pub. No.: WO98/59202

PCT Pub. Date: Dec. 30, 1998

(51) Int. Cl.$^7$ ............................... F25D 23/12
(52) U.S. Cl. .................. 62/259.2; 62/309; 62/314
(58) Field of Search ............... 62/259.2, 309, 62/314

(56) References Cited

U.S. PATENT DOCUMENTS

| | | | |
|---|---|---|---|
| 3,747,362 | * | 7/1973 | Mercer .................................. 62/171 |
| 3,905,205 | * | 9/1975 | Zusmanovich ........................ 62/309 |
| 4,854,129 | * | 8/1989 | Hickley et al. ....................... 62/304 |
| 5,695,117 | * | 12/1997 | Sizemore et al. ..................... 236/44 |
| 5,907,473 | * | 5/1999 | Przilas et al. ........................ 361/699 |
| 5,943,211 | * | 8/1999 | Havey et al. ......................... 361/699 |
| 5,946,931 | * | 5/1999 | Lomax et al. ......................... 62/304 |

FOREIGN PATENT DOCUMENTS

| | | |
|---|---|---|
| 58-56495 | 4/1983 | (JP) . |
| 61-91771 | 6/1986 | (JP) . |
| 4-91459 | 3/1992 | (JP) . |
| 5-102127 | 4/1993 | (JP) . |
| 6-21279 | 1/1994 | (JP) . |
| 7-187250 | 7/1995 | (JP) . |
| 7-226371 | 8/1995 | (JP) . |
| WO97/39294 | 10/1997 | (WO) . |

\* cited by examiner

Primary Examiner—Henry Bennett
Assistant Examiner—Mark Shulman
(74) Attorney, Agent, or Firm—Burns, Doane, Swecker & Mathis, LLP (57) ABSTRACT

According to the present invention, there is provided a water vaporization type cooling apparatus for a small-capacity heating element which permit cooling the heating element to below the outer peripheral temperature and is suitable for environmental protection. The water vaporization type cooling apparatus of a heating element comprises a closed space sealing air therein and housing the heating element therein; a water sump portion provided in the close space for storing water; a waterproof layer formed on the surface of the heating element; a water-bearing layer formed on the surface of the waterproof layer, an end of the water-bearing layer, when the heating element is housed in the closed space, being immersed in water stored in the water sump portion; an air circuit connected the both ends thereof to the closed space, the air circuit forming a closed loop in which air is circulated in cooperation with the closed space; air circulating means, provided in the air circuit, for causing air to flow along the surface of the water-bearing layer by circulating air in the closed loop; dehumidifying means, arranged in the air circuit, for recovering through condensation and separation of water contained in air flowing along the surface of the water-bearing layer; and water returning means for returning water recovered by the dehumidifying means the water sump portion, wherein water impregnated in the water-bearing layer is vaporized by causing air to flow along the surface of the water-bearing layer so that the heating element is cooled by the latent heat of vaporization of water.

8 Claims, 13 Drawing Sheets

WATER VAPORIZATION TYPE COOLER FOR HEAT-GENERATING ELEMENT

FIELD OF THE INVENTION

The present invention relates to a cooling apparatus of a computer storage unit or an electronic substrate mounting an LSI and other electronic devices to be mounted on an electronic equipment or an electrical power equipment. More particularly, the invention relates to a compact water vaporization type cooling apparatus excellent in cooling property, which permits inhibition of a temperature increase by eliminating heat generation from electronic parts or a computer storage unit, and ensures normal operation even in an environment of a temperature over the maximum service temperature of an electronic equipment.

DESCRIPTION OF THE RELATED ART

For the purpose of cooling electronic parts including LSIs mounted on an electronic equipment or an electrical power equipment, it has been the conventional practice to dissipate the heat generated from heating members such as an LSI through combination of a refrigerant bag and a heat pipe, as disclosed, for example, in Japanese Unexamined Patent Publication No. 6-21,279.

Figure 13:
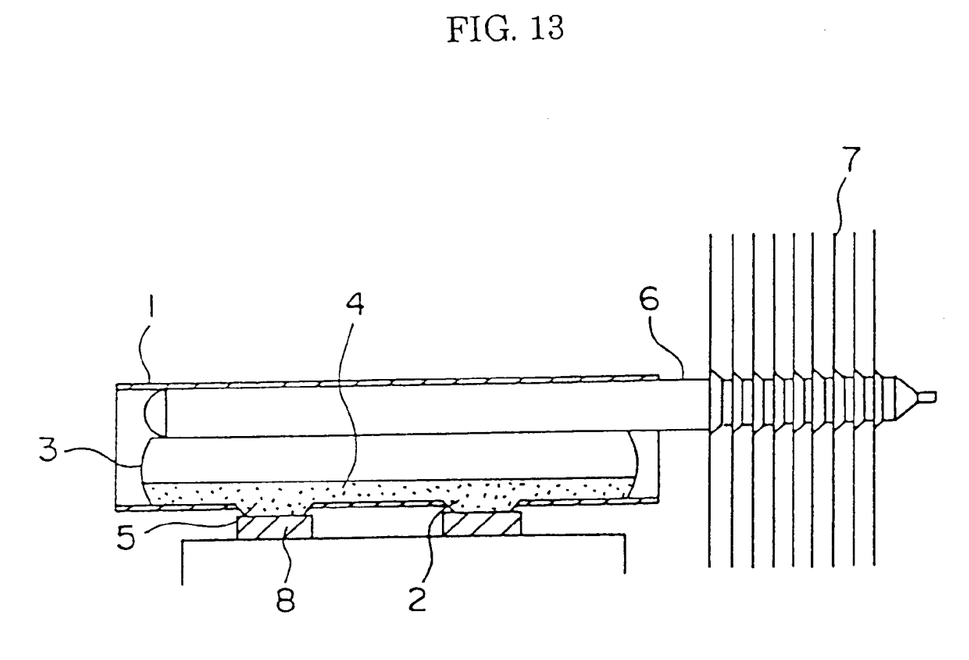
FIG. 13 is a configuration diagram illustrating a conventional heat transfer apparatus.

FIG. 13 is a configuration diagram illustrating a conventional heat transfer apparatus, for example, disclosed in Japanese Unexamined Patent Publication No. 6-21,279.

In the drawing, a protective metallic container 1 has an opening 2 provided in the bottom thereof A refrigerant bag 3 is housed in the lower part of the protective metallic container 1. The refrigerant bag 3 has a configuration in which the both ends of a cylinder made of a soft plastic material such as polyethylene are sealed by heat sealing, and filled with an operating liquid 4, with the upper space filled with a gas. When this refrigerant bag 3 is housed in the protective metallic container 1, a part of the refrigerant bag 3 projects from the opening 2, and there is formed a contact portion 5 coming into contact with an object 8 of cooling such as the LSI.

Further, a heat transfer pipe 6 is housed in the protective metallic container 1 as if it were wrapped by the refrigerant bag 3. A radiator fin 7 is attached to an end of the heat transfer pipe 6 projecting outside from the protective metallic container 1.

Applicable operating liquids 4 include halogen-based solvents such as flon and p-fluorocarbon ($C_6F_{14}$).

Operations of the conventional heat transfer apparatus will now be described.

The heat transfer apparatus is installed so that the contact portion 5 comes into contact with the object 8 of cooling such as an LSI. Heat generated by the object 8 of cooling is transferred from the contact portion 5 to the operating liquid 4. The operating liquid 4 is evaporated by the heat transferred from the contact portion 5. The thus generated vapor rises up through the upper space of the refrigerant bag 3, and upon reaching the portion in contact with the heat transfer pipe 6, the heat is absorbed by the heat transfer pipe 6 there, the condensed vapor being liquefied and dropping. Through this exchange of latent heat, the heat is absorbed by the heat transfer pipe 6. Then, the heat is dissipated from the radiator fin 7 provided at an end of the heat transfer pipe 6. By repeating this process of heat exchange, the object 8 of cooling is cooled.

In the conventional heat transfer apparatus having the configuration as described above, the object 8 of cooling cannot be cooled beyond the outer periphery temperature of the radiating section, and therefore, the apparatus cannot be operated in an environment including a temperature of over the maximum working temperature of the electronic equipment. There is therefore a problem of limited environments of use.

Since a halogen-based solvent such as flon or perfluorocarbon is used as the operating liquid 4, the refrigerant must be collected upon abolishing the apparatus for environmental protection purposes. However, many of electronic equipments are supplied to a market composed of unspecified users, and this has posed the problem of establishing a method of collection.

In general, an electronic equipment should meet the requirement for downsizing. The aforementioned structure of the heat transfer apparatus however comprises many components near the substrate, and this has prevented the problem of downsizing from being solved.

The object 8 of cooling is in mechanical contact with the refrigerant bag 3. This results in a large contact heat resistance, leading to a further larger heat density. As a result, there is posed another problem of impossibility to take sufficient actions to satisfy the requirement for a cooling method excellent in cooling performance.

DISCLOSURE OF THE INVENTION

The present invention was developed to solve the aforementioned problems and has an object to provide a compact water vaporization type cooling apparatus of a heating element, which permits cooling of the heating element to a temperature lower than the outer periphery temperature of the heating element, without limitation of the working environment, and is suitable for environmental protection purposes.

The water vaporization type cooling apparatus of a heating apparatus of the invention comprises a closed space sealing air therein and housing the heating element therein; a water sump portion provided in the close space for storing water; a waterproof layer formed on the surface of the heating element; a water-bearing layer formed on the surface of the waterproof layer, an end of the water-bearing layer, when the heating element is housed in the closed space, being immersed in water stored in the water sump portion; an air circuit connected the both ends thereof to the closed space, the air circuit forming a closed loop in which air is circulated in cooperation with the dosed space; air circulating means, provided in the air circuit, for causing air to flow along the surface of the water-bearing layer by circulating air in the closed loop; dehumidifying means, arranged in the air circuit, for recovering through condensation and separation of water contained in air flowing along the surface of the water-bearing layer; and water returning means for returning water recovered by the dehumidifying means the water sump portion, wherein water impregnated in the water-bearing layer is vaporized by causing air to flow along the surface of the water-bearing layer so that the heating element is cooled by the latent heat of vaporization of water.

DESCRIPTION OF THE PREFERRED EMBODIMENTS

A few preferred embodiments of the present invention will now be described with reference to the drawings.

First Embodiment

Figure 1:
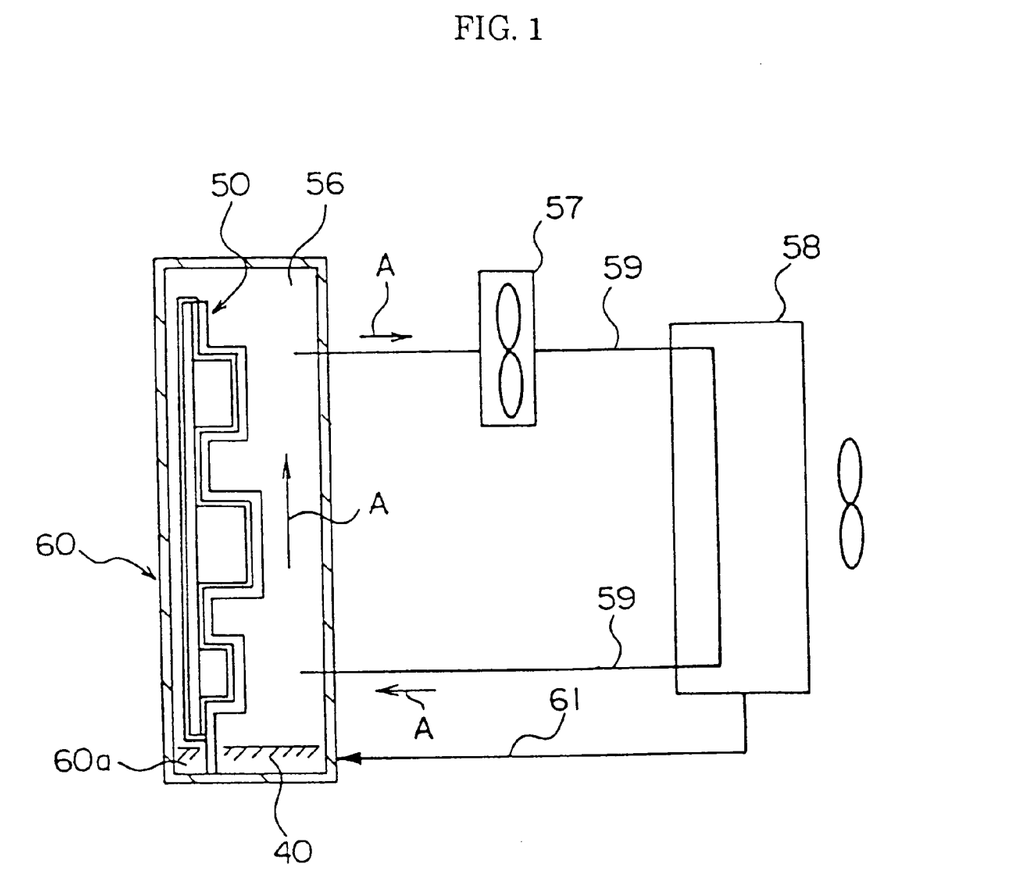
FIG. 1 is a system configuration diagram illustrating a water vaporization type cooling apparatus a first embodiment of the present invention.
Figure 2:
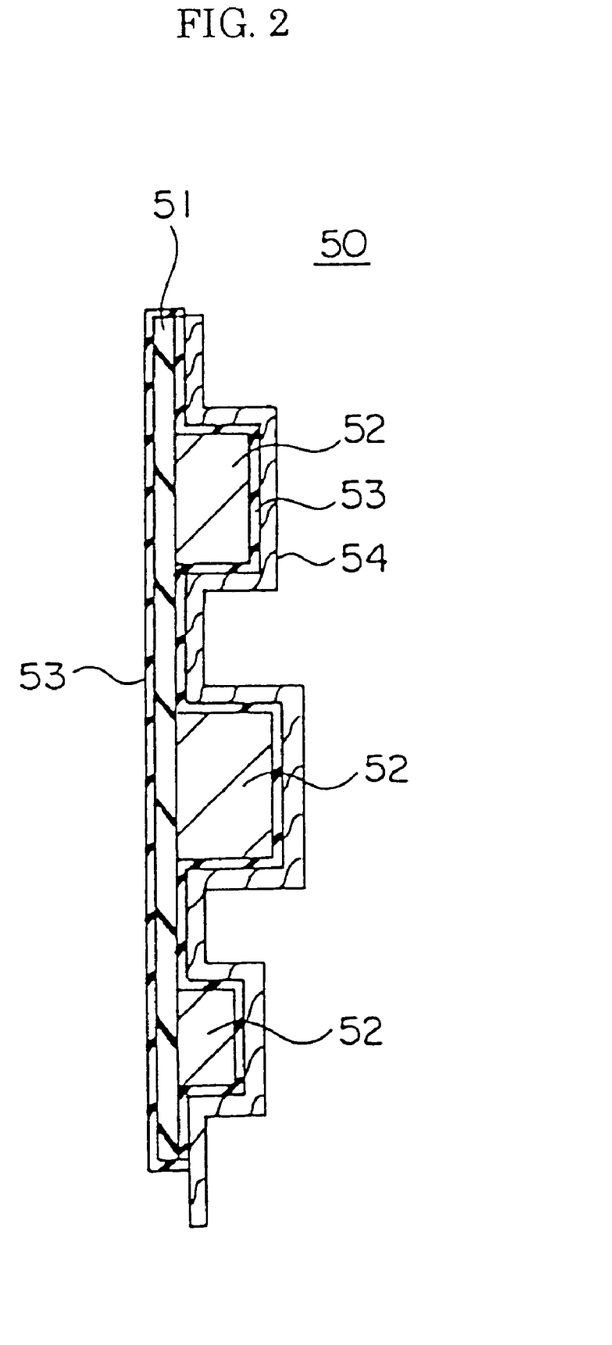
FIG. 2 is a sectional view illustrating a radiator section formed on the surface of heating element in the water vaporization type cooling apparatus of the first embodiment of the invention.

FIG. 1 is a system configuration diagram illustrating a water vaporization type cooling apparatus of the first embodiment of the present invention; and FIG. 2 is a sectional view illustrating a radiator section formed on the surface of a heating element in the water vaporization type cooling apparatus of the first embodiment of the invention.

In FIG. 1, the heating element 50 comprises electronic parts 52 such as LSIs and resistors mounted on an electronic substrate 51 as shown in FIG. 2, and a waterproof layer 53 and water-bearing layer 54 are formed on the surface thereof. The waterproof layer 53 is formed by coating, for example, an epoxy resin paint having a low dielectric rate, not water-permeable, and a satisfactory electric insulation. The waterproof layer 53 is formed into the minimum thickness permitting prevention of water permeation, so as not to increase thermal resistance.

Figure 3:
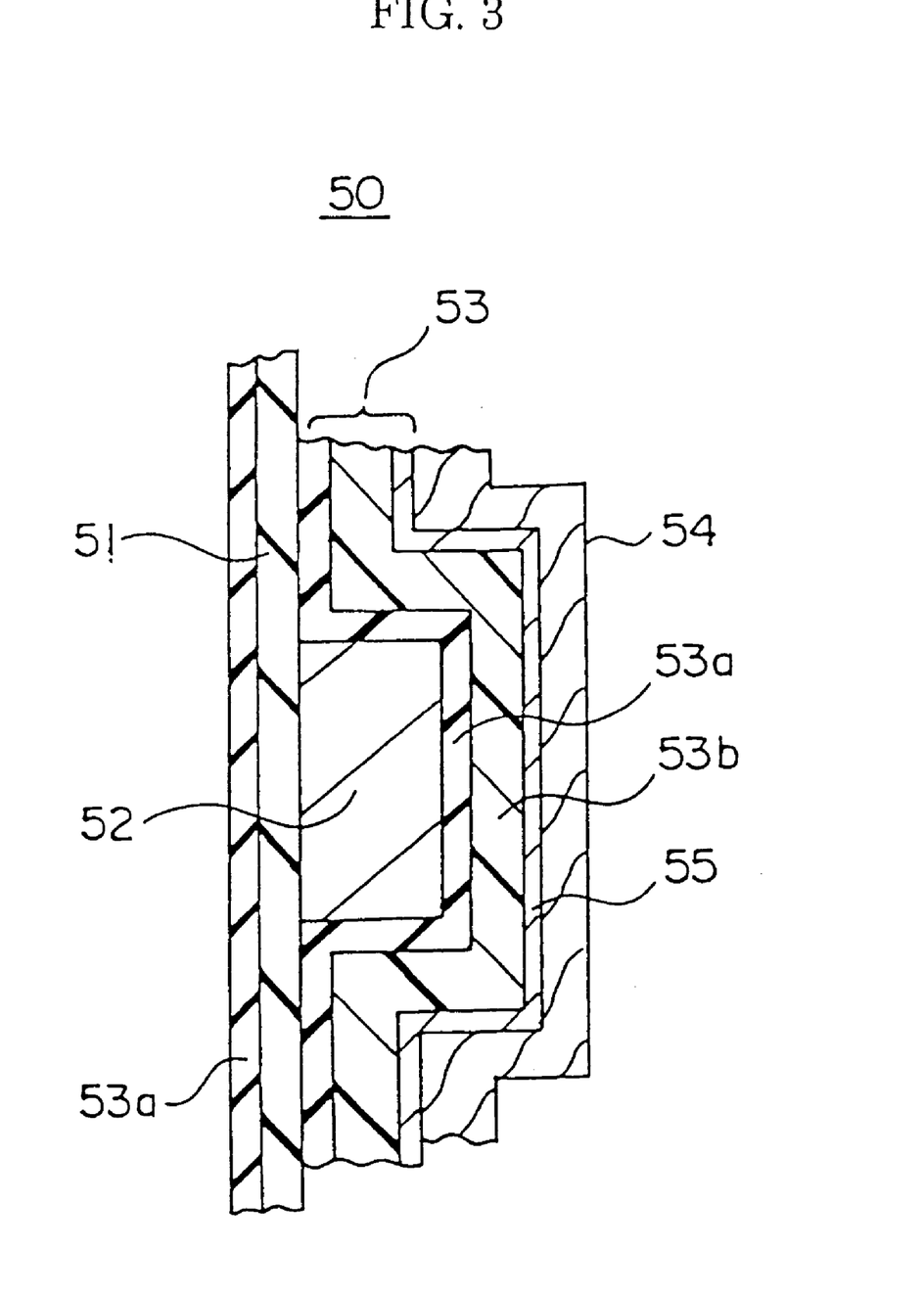
FIG. 3 is a partially enlarged sectional view illustrating another example of the radiator section formed on the surface of the heating element in the water vaporization type cooling apparatus of the first embodiment the invention.

With a view to presenting permeation of water, the waterproof layer 53 may be of a double-film structure in which a thin electric insulating paint film 53a is formed and then a thermally conductive paint film 53b formed thereon as shown in FIG. 3. Or, it may be of a multiple-film structure having further a metallic layer 55 thereon. A metallic layer 55 may be formed on the electric insulating paint film 53a. A water-repellent material may be coated as an outermost layer of the waterproof layer 53, to make the surface of the waterproof layer 53 water-repellent.

The water-bearing layer 54 is formed by providing a nonwoven fabric, a cloth-like material, a porous material or a net-like element, which has a remarkable effect of sucking up water by capillary phenomenon, on the waterproof layer 53. The water-bearing layer 54 is formed so as to uniformly cover even the irregular surface of the heating element, as shown in FIG. 3.

A can element 60 forms a closed space 56, with water 40 stored in a water sump portion 60a provided at the bottom thereof The heating element 50 having the configuration as described above is housed in the can element 60 so that an end of the water-bearing layer 54 is immersed in water 40. This can element 60 and a dehumidifying unit 58 serving as dehumidifying means are connected by a pipe conduit 59 serving as an air circuit to form a closed loop. An air circulator 57 serving as air circulating means is arranged in the pipe conduit 69 to achieve a configuration allowing circulation of circulation air through the closed loop. The bottom of the dehumidifying unit 58 is connected to the bottom of the can element 60 by a water return pipe 61 serving as water returning means, so that water accumulated on the bottom of the dehumidifying unit 58 is returned to the water sump 60a of the can element 60 via the water return pipe 61.

Figure 4:
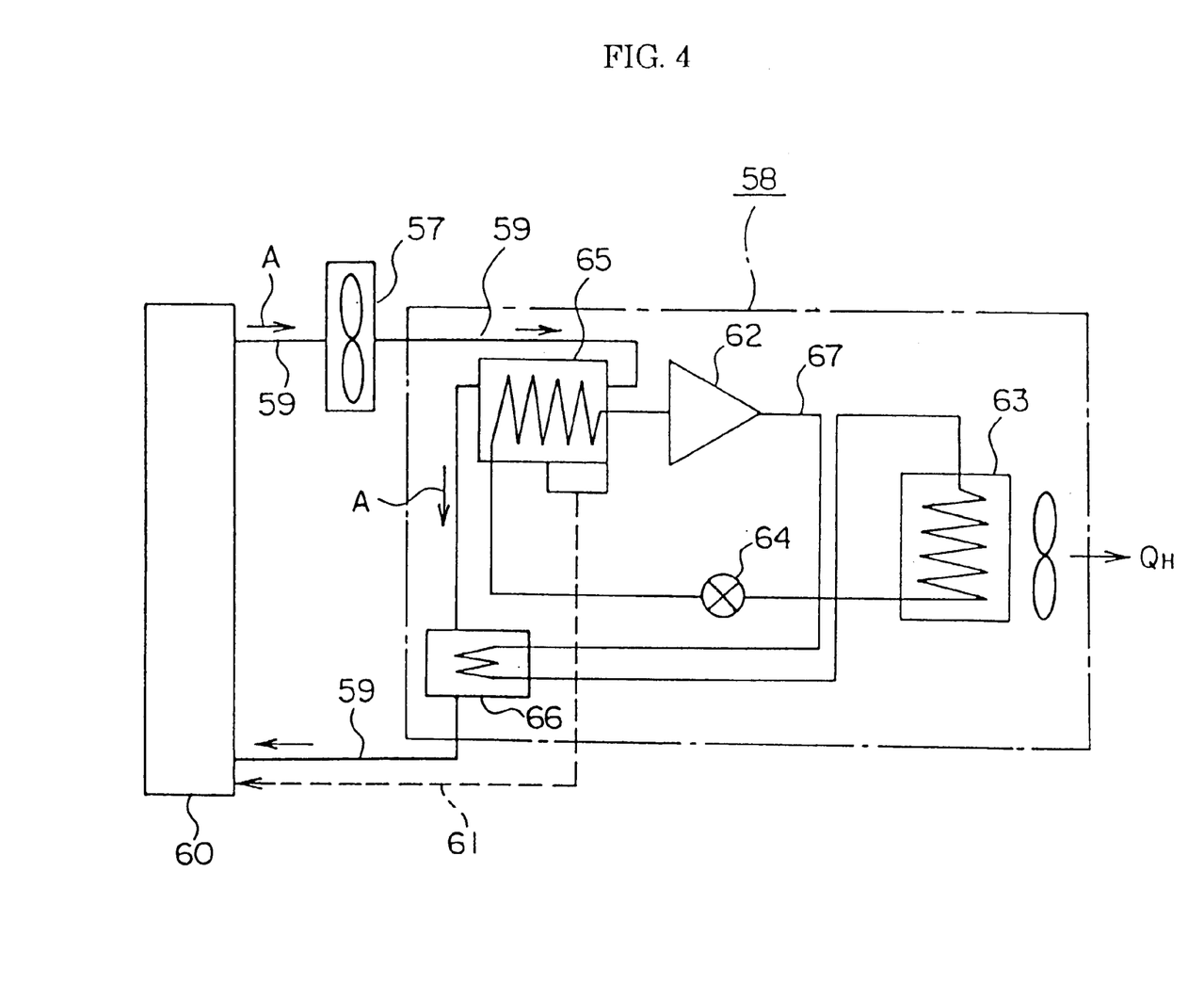
FIG. 4 is a system configuration diagram in which a dehumidifying unit applied to the water vaporization type cooling apparatus of the first embodiment of the invention is composed of a refrigerant compression type air cooler.

A system configuration in which the dehumidifying unit 58 comprises a refrigerant compression type air cooler is illustrated in FIG. 4.

The dehumidifying unit 58 comprises a refrigerant compressor 62, a refrigerant condenser 63, an expansion valve 64, a vaporizer 65, an air heater 66 and a pipe conduit 67 forming a closed loop by connecting the aforementioned components. Circulating air circulated by the air circulator 57 flows on the secondary side of the vaporizer 65 and the air heater 66.

A refrigerant circulates through this closed loop. The refrigerant in the vaporizer 65 is compressed in the refrigerant compressor 62, and is fed via the air heater 66 to the refrigerant condenser 63. The compressed refrigerant is condensed through dissipation of heat QH by the refrigerant condenser 63 to outside the system, and then subjected to adiabatic free expansion via the expansion valve 64. The adiabatically free-expanded refrigerant is sent to the vaporizer 65 and the air flowing on the secondary side is cooled to below the dew point through heat absorption QL under the cooling action generated during the course of adiabatic free expansion.

The cooling action of the water vaporization type cooling apparatus of the first embodiment will now be described.

Figure 5:
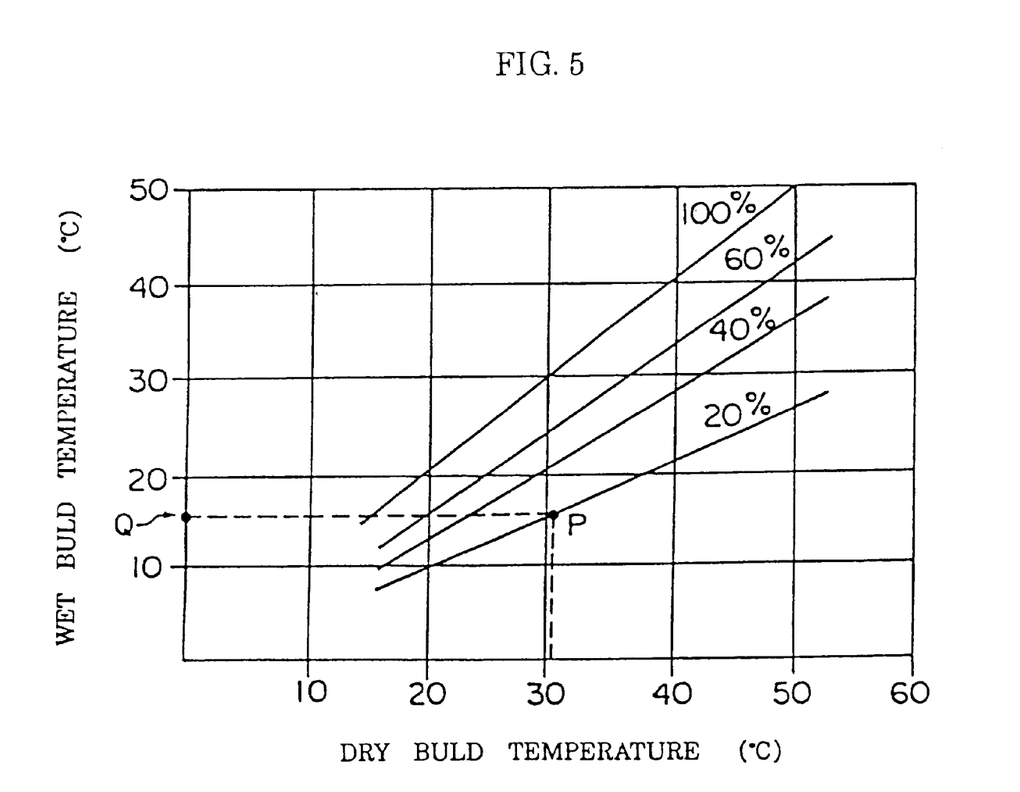
FIG. 5 illustrates the cooling principle of the water vaporization type cooling apparatus of the invention.

Upon driving of the air circulator 57, the circulating air circulates through the closed loop as shown by the arrow A in FIG. 1. When the dried air flows along the arrow A on the surface of the water-bearing layer 54, temperature of water contained in the water-bearing layer 54 decreases toward the dew point. In the diagram shown in FIG. 5, for example, when air has an entry temperature of 32° C. and a humidity of 20% (corresponding to point P in FIG. 5), temperature of water in contact with this air enthalpically varies along the straight line PQ in FIG. 5 and decreases to a wed bulb temperature (TW) of 17° C. (corresponding to point Q in FIG. 5). This is attributable to the fact that water evaporates into the dried air, thus absorbing humidity, and temperature decreases as a result of the evaporation latent heat deprived of upon evaporation of water. The water bearing layer 54 is thus cooled, absorbs heat from the heating element 50 thermally connected to this water bearing layer 54, and thus cools the heating element 50 toward the dew point.

An end of the water bearing layer 54 is immersed in water 40 stored in the water sump portion 60a of the can element

60. Water 40 is sucked up onto the entire surface of the water-bearing layer 54 under the effect of capillary phenomenon to replenish water having been evaporated from the surface of the water-bearing layer 54.

Air having been flowing along the surface of the water-bearing layer 54 acquires a higher humidity by absorbing water evaporated from the water-bearing layer 54, and flows from the can element 60 onto the secondary side of the vaporizer 65 forming the dehumidifying unit 58. Air flowing onto the secondary side of the vaporizer 65 is cooled to below the dew point by heat absorption QL under the cooling effect generated during the course of adiabatic free expansion at the expansion valve 64. As a result, water contained in the air is condensed into condensed water which is stored in the bottom portion of the vaporizer 65. Condensed water stored on the bottom of the vaporizer 65 is gradually collected through the water return pipe 61 onto the bottom of the can element 60. Air deprived of water in the vaporizer 65 is sent to the air heater 66, heated to the room temperature, and fed to the can element 60 in the form of dried air.

Figure 6:
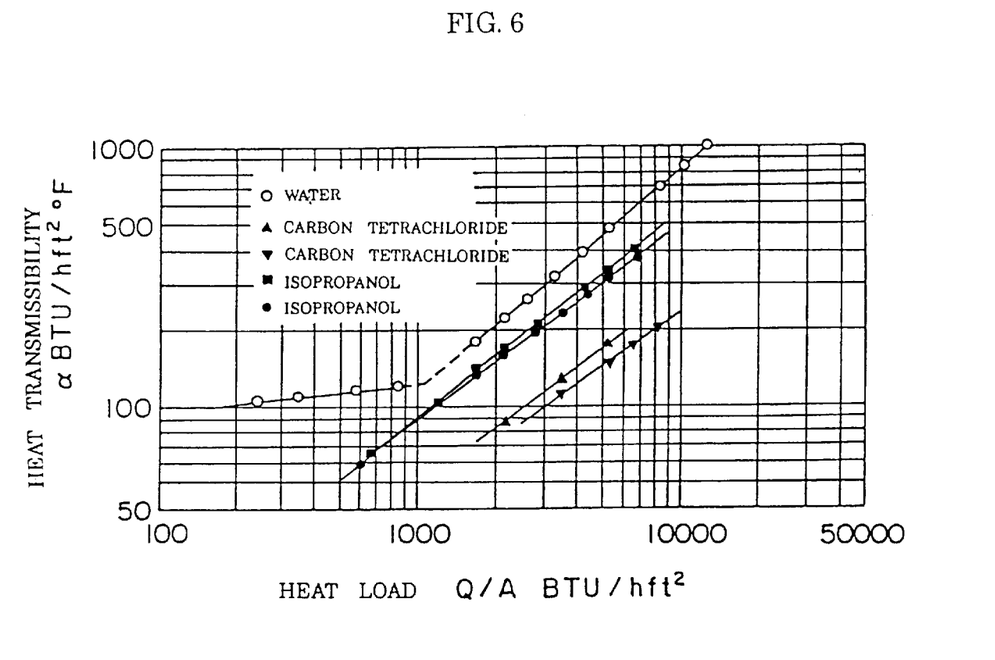
FIG. 6 illustrates the cooling effect of the water vaporization type cooling apparatus of the invention.

In the first embodiment, water is used as a refrigerant, and the heating element 50 is cooled by evaporation thereof. The relationship between the heat flux charged into the liquid and boiling heat transfer is illustrated in FIG. 6, which suggests that water has a larger boiling heat transfer as compared with the other liquids. Therefore, water can be the most effective refrigerant for cooling a heating element having a large calorific value per unit area.

Figure 7:
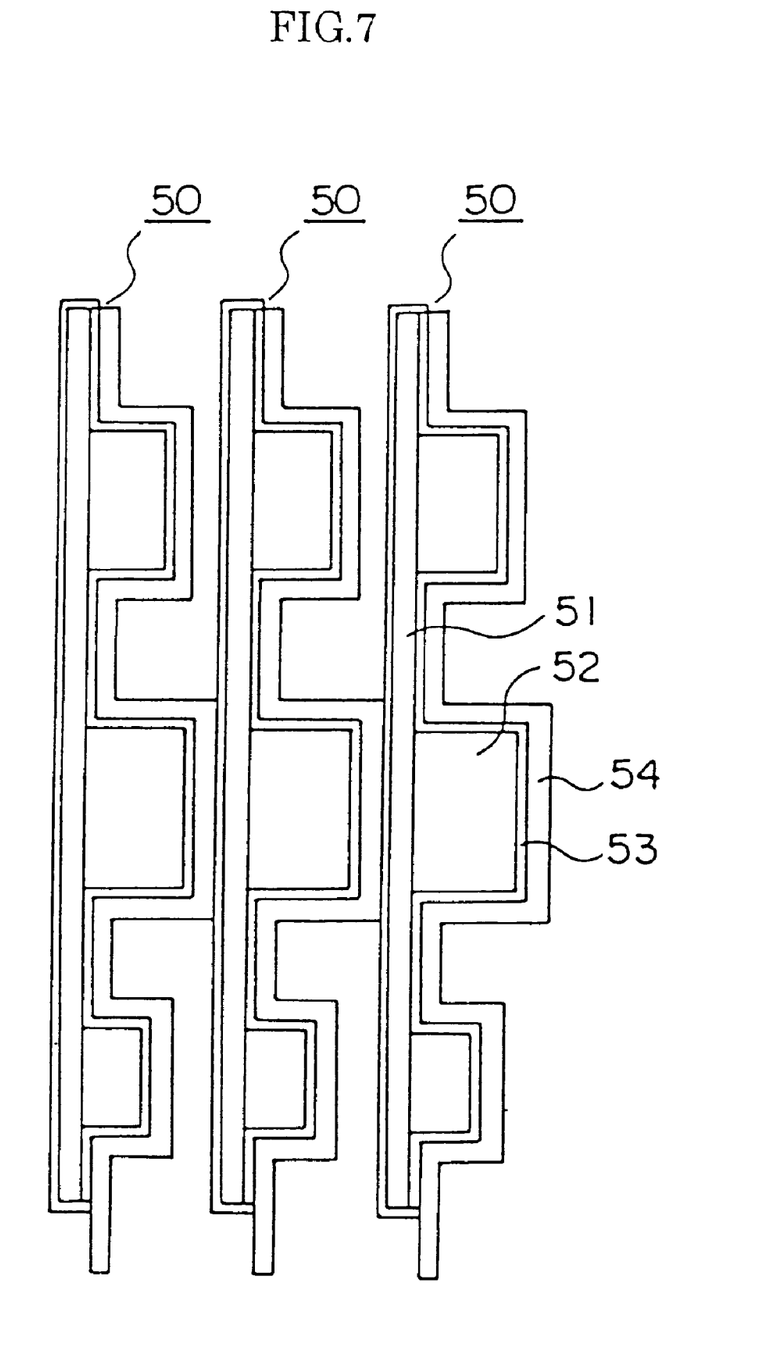
FIG. 7 is a layout diagram illustrating another example of the heating element applied to the water vaporization type cooling apparatus of the first embodiment of the invention.

Cooling in the first embodiment is, different from cooling by the used of air sensible heat, based on latent heat of water vaporization. The water vaporization latent heat is large as 590 kcal/kg, which gives a remarkable cooling efficiency with a slight amount of circulated refrigerant. Because the circulated air serves only as a carrier medium for transporting steam resulting from evaporation of water, a very small amount of air suffices, as compared with the cooling method based on utilization of sensible heat using the specific heat of 0.24 kcal/kg° C. of air in air cooling. Even when cooling simultaneously a plurality of substrates, therefore, it is not necessary to form a large air channel, and even when the substrates are arranged in close contact with each other as shown in FIG. 7, a sufficient cooling effect is available only by passage of air between the substrates.

According to the first embodiment as described above, water temperature is reduced to below the outer periphery temperature by forming the water bearing layer 54 on the surface of the heating element 50, flowing dried air along the surface of the water-bearing layer 54, and vaporizing water in the water-bearing layer 54, and depriving of the evaporation latent heat upon evaporation water. The water vaporization type cooling apparatus can therefore be operated even in an environment including a temperature of at least the maximum operating temperature of the electronic equipment, and there is no limitation on the working environment.

Since air is used as a refrigerant, collection of the refrigerant is not required from environmental protection consideration as in the case of using a halogen-based solvent such as flon or p-fluorocarbon, and thus a cooling apparatus causing no environmental problem is available.

Because the cooling mechanism is based on the evaporation latent heat of water, a large cooling efficiency is available with a slight amount of circulated refrigerant. Circulation of air serves only as a carrier medium for transporting evaporated steam. The amount of blown air can be extremely small. It is no therefore necessary to provide a large-capacity air circulator 57 or a large air channel, thus permitting downsizing of the cooling apparatus.

The waterproof layer 53 is formed by coating a material not water-permeable and excellent in electric insulation. This layer can therefore be formed easily on the surface of the heating element 50, irrespective of the surface condition thereof. It is therefore possible to certainly prevent water contributing to cooling from reaching the heating element 50 by the presence of the waterproof layer 53, and hence to assure stable operation of the heating element.

Because the water-bearing layer 54 can be provided via the water proof layer 53 on the surface of the heating element 50, the contact heat resistance is reduced, and an excellent cooling property is available.

Second Embodiment

Figure 8:
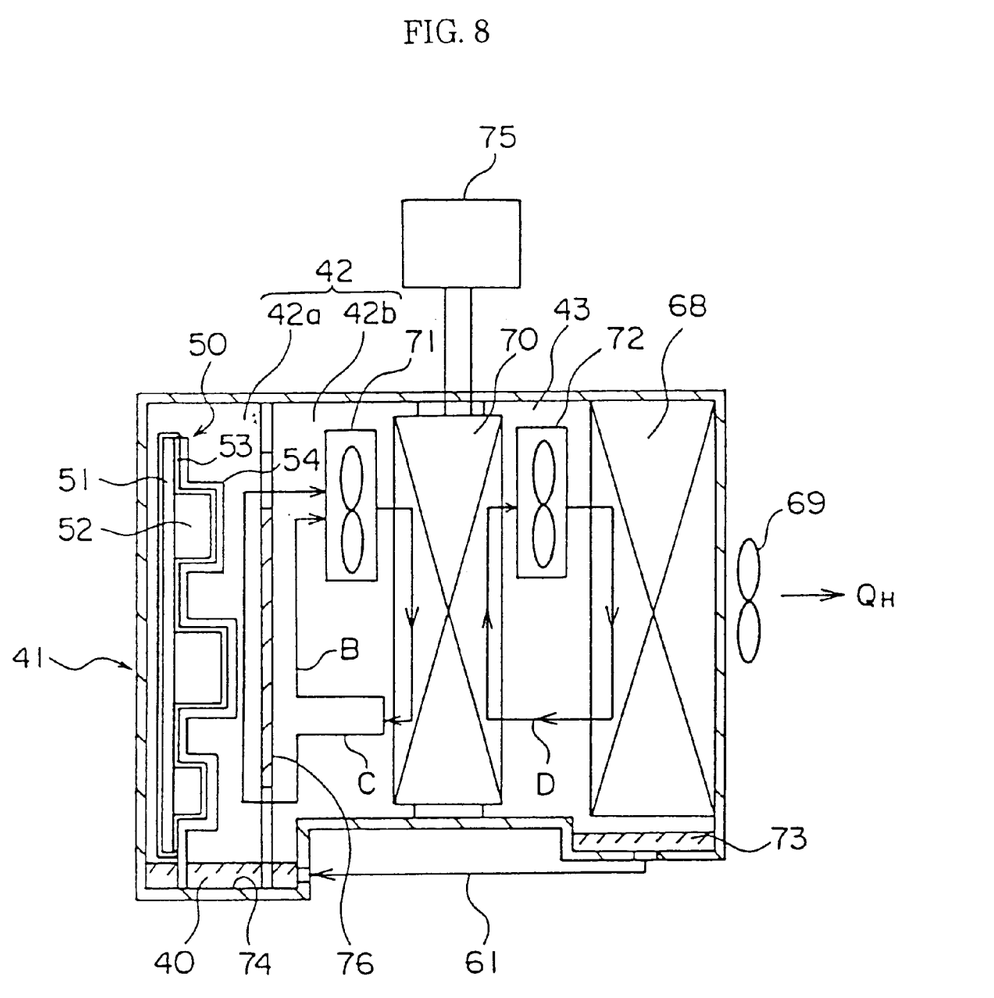
FIG. 8 is a system configuration diagram illustrating a water vaporization type cooling apparatus of a second embodiment of the invention.

FIG. 8 is a system configuration diagram illustrating a water vaporization type cooling apparatus of a second embodiment of the invention.

In the drawing, a water vapor exchange module 70 is arranged in a can element 41 sealing air therein so as to divide the inside of the can element into a first closed space 42 and a second closed space 43. A partition 67 serving as a partition member is arranged so as to divide the first closed space 42 into two closed spaces 42a and 42b. Upper and lower openings are provided in this partition 76 so that the two closed spaces 42a and 42b communicate with each other at upper and lower sides. The closed space 42a corresponds to the closed space housing the heating element 50, and the closed space 42b corresponds to the air circuit forming a closed loop together with the closed space 42a.

The heating element 50 is housed in the closed space 42a so that an end of the water-bearing layer 54 is immersed in water stored in the water sump portion 74. Fans 71 and 72 serving as air circulating means are arranged in the upper portions of the closed space 42b and the second space 43, respectively. A water condenser 68 is arranged at an end of the can element 41 composing the second closed space 43. A water sump portion 73 is provided on the bottom of the second closed space 43 of the can element 41, and connected to the water sump portion 74 by a water return pipe 61. A cooling fan 69 is arranged on a side of the water condenser 68 facing the open air to cool the surface of the water condenser 68 and dissipate condensation heat QH of water to the open air. Further, a DC power source 75 supplying power to the water vapor exchange module 70 is provided.

Figure 9:
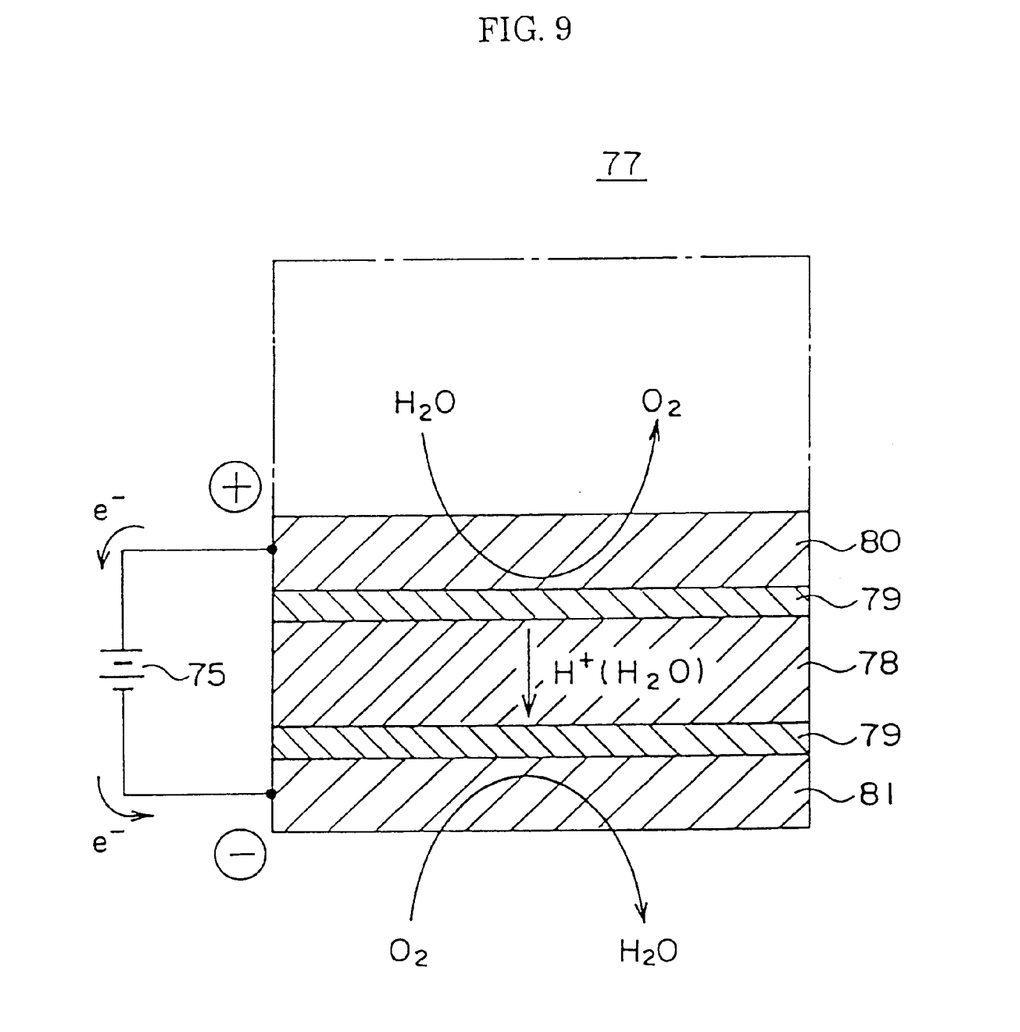
FIG. 9 is a sectional view illustrating a basic structure of a solid electrolytic element composing a water-vapor exchange module used in the water vaporization type cooling apparatus of the second embodiment of the invention.

A solid electrolytic element 77 applied to the water vapor exchange module 70 has a basic structure in which, as shown in FIG. 9, anode 80 and a cathode 82 are arranged via a catalyst layer 79 accelerating electrolytic reaction so as to hold in between a solid polyelectrolytic membrane 78 for selectively causing hydrogen ions (protons) to pass through. These components are bonded by thermocompression into a composite membrane. An applicable solid polyelectrolytic membrane 78 is NAFION (a registered trademark of Du Pont). As a material for the anode 80 and the cathode 81, an expanded metal plated with platinum is employed. As a material for the cathode 81, a nonwoven fabric of carbon fiber may also be used.

Figure 10:
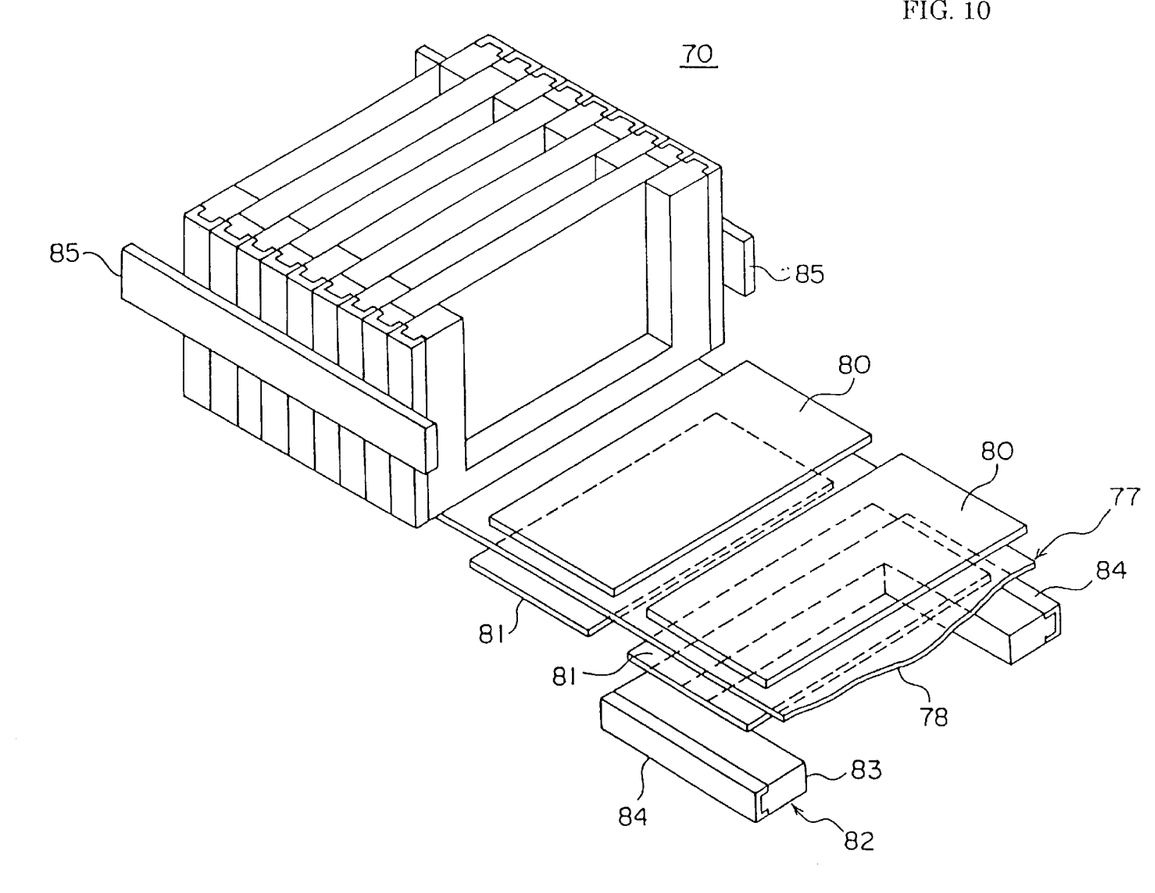
FIG. 10 is a perspective view illustrating the water-vapor exchange module used in the water-vaporization type cooling apparatus of the second embodiment of the invention.

The structure of the water vapor exchange module 70 will now be described with reference to FIG. 10.

Frames 82 comprises a U-shaped insulating support frame 83 and conductors 84 attached to the opposing edges on both the sides of the opening of the frame 83. The solid electrolytic elements 77 are constituted in such a manner that anodes 80 and cathodes 81 are arranged at prescribed intervals in the longitudinal direction of the belt-shaped solid polyelectrolytic membrane 78 so as to face each other with the solid polyelectrolytic membrane 78 between. The anode 80 extends in one of the width directions of the solid polyelectrolytic membrane 78, whereas the cathode 81 extends in the other of the width directions of the solid polyelectrolytic membrane 78.

The solid electrolytic element 77 is folded at the outer periphery of the side opposing the opening of each of the frames 82 arranged in such a manner that the openings alternately face upward and downward, and held between adjacent frames 82 to form into a corrugated form, i.e., into a three-dimensional shape. Each anode 80 is electrically connected to a conductor 84 on one side of the adjacent frames 82, and each cathode 81 is electrically connected to the conductor 84 on the other side of the adjacent frames 82. A pair of feeding buses 85 are arranged on the both sides of a laminated product of frames 82, so as to permit feeding to the solid electrolytic element 77 via the conductors 84.

The water vapor exchange module 70 having the configuration as described above is arranged at the center of the can element 41 so that the opening on the anode side faces the closed space 42b and the opening on the cathode side faces the second closed space 43.

Cooling operation of the water vaporization type cooling apparatus of the second embodiment will now be described.

When the fan 71 is driven, air in the closed space 42a is sucked into the closed space 42b, and exhausted from the exhaust side of the fan 71 toward the electrolytic reaction surface on the anode side of the water vapor exchange module 70. Air then descends along the electrolytic reaction surface on the anode side of the water vapor exchange module 70. Apart of air having descended along the electrolytic reaction surface on the anode side of the water vapor exchange module 70 is fed into the closed space 42a, as shown by an arrow C in FIG. 8, ascends along the surface of the water-bearing layer 54, then flows into the closed space 42b, and is sucked into the sucking side of the fan 71. The rest of air having descended along the electrolytic reaction surface on the anode side of the water vapor exchange module 70 ascends through the closed space 42b along the partition 76 as shown by an arrow B in FIG. 8 and is sucked into the sucking side of the fan 71.

At this point, power is supplied between the anode 80 and cathode 81 of the water vapor exchange module 70 from the DC power source 75. On the electrolytic reaction surface on the anode side of the water vapor exchange module 70, water contained in air is electrolyzed, and oxygen is generated from decomposition of water molecules through the reaction as expressed by Formula (1):

$$\text{Anode side: } H_2O \rightarrow O_2 + 4H^+ + 4e^- \quad (1)$$

Further, a few (1 to 3) water molecules move, together with hydrogen ions, from the anode side via the solid polyelectrolytic membrane 78 to the cathode side. Water molecules are consumed on the anode side, and water molecules move, together with hydrogen ions, to the cathode side. Air having descended along the electrolytic reaction surface on the anode side of the water vapor exchange module 70 is thus dehumidified into dried air. A part of this dried air is sent to the closed space 42a, flows along the surface of the water-bearing layer 54, and causes water to evaporate from the surface of the water-bearing layer 54. The dried air contains steam evaporated from the surface of the water bearing layer 54, and the thus humidified air is returned to the closed space 42b. The water-bearing layer 54 is cooled in the process of water evaporation, and consequently, the heating element 50 thermally connected to the water-bearing layer 54 is cooled.

Hydrogen ions ($H^+$) generated during electrolysis of water as described above pass through the solid polyelectrolytic membrane 78 and reach the cathode 81. On the other hand, electrons ($e^-$) generated during the course of electrolysis of water pass through an external circuit and reach the cathode 81. On the cathode side, oxygen is consumed and water is generated by the reaction shown by Formula (2):

$$\text{Cathode side: } O_2 + 4H^+ + 4e^- \rightarrow H_2O \quad (2)$$

As a result, air in the second closed space 43 is humidified into saturated air. When the fan 72 is driven, air circulates in the second closed space 43 as show by an arrow D in FIG. 8. The saturated air is cooled by releasing heat QH to the open air under the effect of the cooling fan 69 on the cooling surface of the water condenser 68. Steam contained in the air is condensed into condensed water which drops down into the water sump portion 73 and is stored there. Water stored in the water sump portion 73 is returned via the water return pipe 61 gradually to the water sump portion 74 to serve for replenishing water evaporated from the water-bearing layer 54.

In the first embodiment, the dehumidifying unit 58 comprising the refrigerant compressor 62, the refrigerant condenser 63, the expansion valve 64, the vaporizer 65 and the heater 66, and a pipe conduit 67 forming a closed loop by connecting these components is used as dehumidifying means. As a result, the apparatus is inevitably large in size, and although the apparatus is applicable to cool a large capacity device bearing a heat load of at least several hundreds of W, it is not applicable to cool a small-capacity device having an amount of generated heat of up to several tens of W. According to the second embodiment, however, the water vapor exchange module 70 comprising solid electrolytic elements 77 in which the anode 80 and the cathode 81 are formed via the catalyst layer 79 on the both sides of the hydrogen ion conductive solid polyelectrolytic membrane 78 is used. There is therefore available compact dehumidifying means applicable to a device having an amount of generated heat of up to several tens of W.

The water vapor exchange module 70 comprises solid electrolytic elements 77 formed into a three-dimensional shape, resulting in a larger area of electrolytic reaction per unit area and an improved cooling efficiency, and permitting downsizing of the apparatus.

The partition 76 is arranged so as to divide the first closed space 42 into the two closed spaces 42a and 42b communicating with each other at upper and lower sides. Therefore, a part of air having descended along the electrolytic reaction surface on the anode side of the water vapor exchange module 70 is sent to the closed space 42a as shown by the arrow C in FIG. 8, ascends along the surface of the water-bearing layer 54, flows thereafter into the closed space 42b, and is subjected onto the electrolytic reaction surface on the anode side. The rest of the air ascends through the closed space 42b along the partition 76, and is subjected to the electrolytic reaction surface on the anode side. The flow of air flowing on the electrolytic reaction surface on the anode side of the water vapor exchange module 70 becomes larger in size while being maintained in the turbulent flow region. As a result, air flowing along the electrolytic reaction surface of the water vapor exchange module 70 flows at a higher velocity, thus making it possible to increase the electrolytic reaction rate of the water vapor exchange module 70. On the other hand, the flow rate of air flowing along the surface of the water bearing layer 54 becomes smaller. However, because air flowing along the surface of the water bearing layer 54 serves only as a carrier medium of generated steam, it never affects the cooling performance of the heating element 50. Joule heat is produced in the water vapor exchange module 70, causing the temperature of circulating air to increase. Because the flow rate of air flowing into the closed space 42*a* becomes smaller, the amount of Joule heat penetrating into the surface of the water bearing layer 54 is reduced, thus permitting improvement of the cooling efficiency.

Third Embodiment

Figure 11:
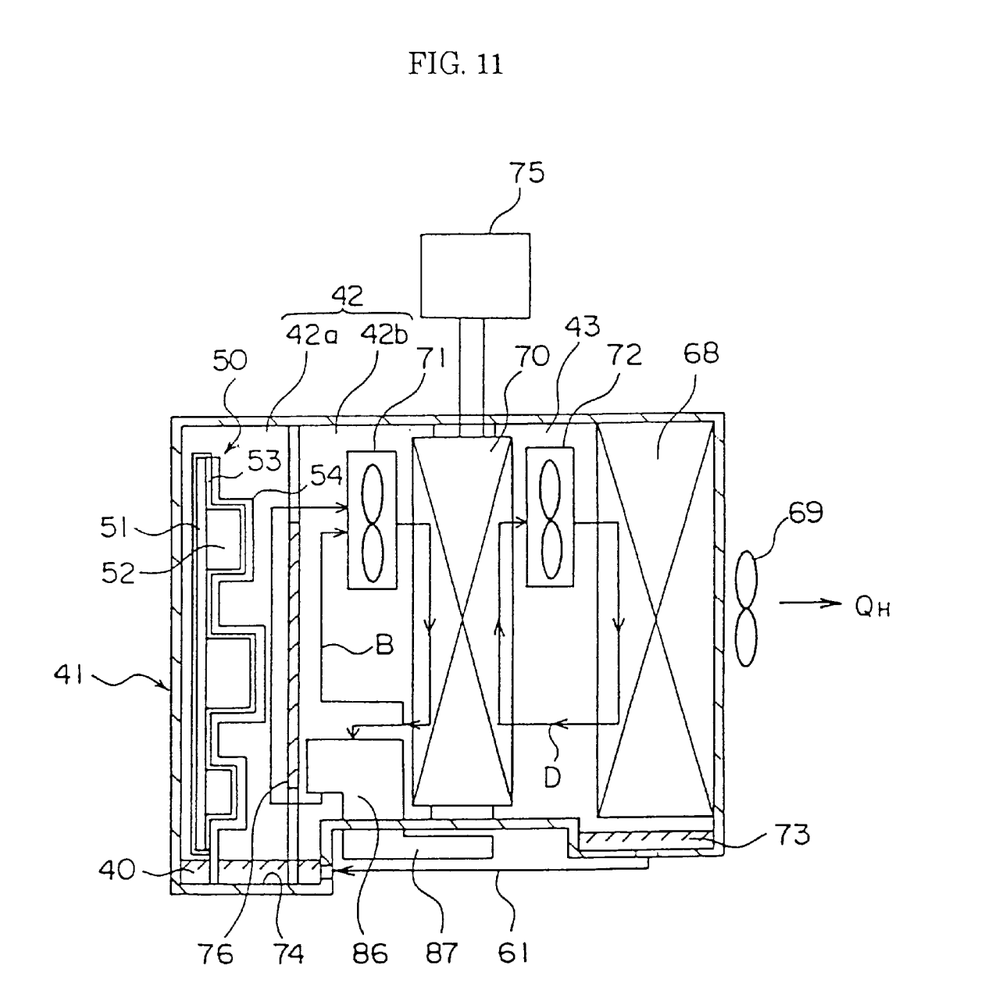
FIG. 11 is a system configuration diagram illustrating a water vaporization type cooling apparatus of a third embodiment of the invention.

In third embodiment of the invention, as shown in FIG. 11, a cooling fin 86 is arranged on the air exhaust side from the closed space 42*b* to the closed space 42*a*, and a part of the cooling fin 86 projects outside the can element 41 to form a radiator fin 87. The cooling fin 86 and the radiator fin 87 constitute an air cooler. The configuration is the same as that in the second embodiment except the above.

According to the third embodiment, joule heat is produced in the water vapor exchange module 70 and causes the temperature of circulating air to increase. Heat of the air flowing into the closed space 42*a* is released to the open air via the cooling fin 86 and the radiator fin 87. The cooled air thus flows along the surface of the water-bearing layer 54, thus further improving the cooling efficiency.

Fourth Embodiment

Figure 12:
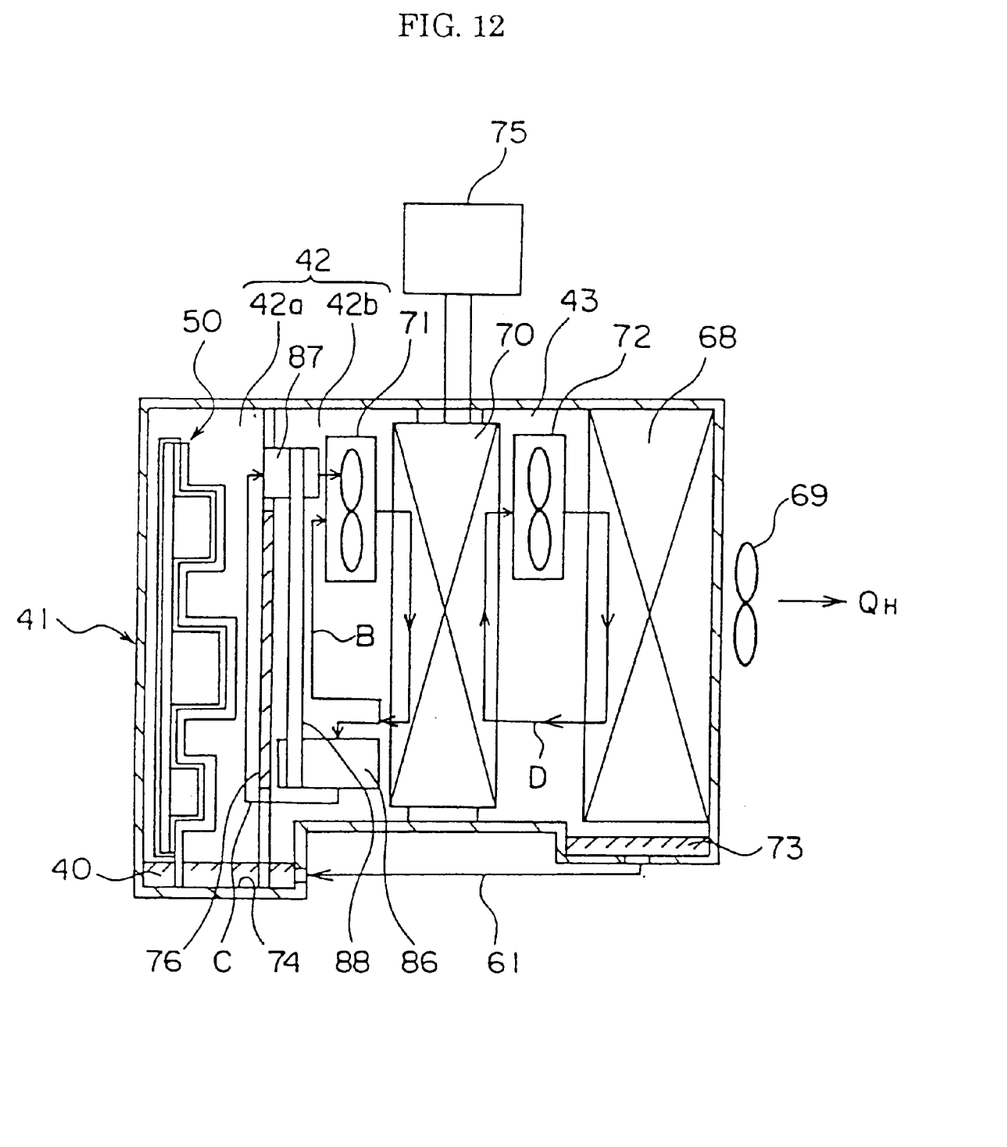
FIG. 12 is a system configuration diagram illustrating a water vaporization type cooling apparatus of a fourth embodiment of the invention.

In the fourth embodiment, as shown in FIG. 12, a cooling fin 86 is arranged on the air exhaust side from the closed space 42*b* to the closed space 42*a*, and a radiator fin 87 is arranged on the air inflow side of the closed space 42*b* from the closed space 42*a*. The cooling fin 86 and the radiator fin 87 are thermally connected by a heat pipe 88. The cooling fin 86, the radiator fin 87 and the heat pipe 88 form an air cooler. The configuration is the same as that in the second embodiment except for the above.

According to the fourth embodiment, air flowing into the closed space 42*a* flows along surface of the water-bearing layer 54 via the cooling fin 86, the heat pipe 88 and the radiator fin 87, and then is cooled by cold air flowing into the closed space 42*b*. Advantages similar to those in the third embodiment as described above are available also in the fourth embodiment.

In the above-mentioned embodiments, the heating element 50 is a product which electronic components 52 such as an LSI and a resistor are mounted on the electronic substrate 51. The heating element 50 is not however limited to the above, but an enclosure containing built-in electronic devices may be employed.

According to the present invention, as described above, the water vaporization type cooling apparatus of the invention comprises a closed space sealing air therein and housing the heating element therein; a water sump portion provided in the close space for storing water; a waterproof layer formed on the surface of the heating element; a water-bearing layer formed on the surface of the waterproof layer, an end of the water-bearing layer, when the heating element is housed in the closed space, being immersed in water stored in the water sump portion; an air circuit connected the both ends thereof to the closed space, the air circuit forming a closed loop in which air is circulated in cooperation with the closed space; air circulating means, provided in the air circuit, for causing air to flow along the surface of the water-bearing layer by circulating air in the closed loop; dehumidifying means, arranged in the air circuit, for recovering through condensation and separation of water contained in air flowing along the surface of the water-bearing layer; and water returning means for returning water recovered by the dehumidifying means the water sump portion, wherein water impregnated in the water-bearing layer is vaporized by causing air to flow along the surface of the water-bearing layer so that the heating element is cooled by the latent heat of vaporization of water. There is therefore available a water vaporization type cooling apparatus which permits cooling of the heating element to below the outer peripheral temperature, with no limitation on the working environment. Because the water bearing layer is in close contact with the heating element, contact heat resistance becomes smaller, and an excellent cooling property is available. Since water is used as a refrigerant, there is no risk of environmental pollution caused by refrigerant, and a cooling apparatus suitable for environmental protection is available.

The above-mentioned waterproof layer comprises an electrically insulating paint film formed by coating an insulating resin not water-permeable onto the surface of the aforementioned heating element. It is therefore possible to easily insulate and protect the heating element surface, irrespective of the surface condition of the heating element.

The aforementioned waterproof layer has a metallic film formed on the surface thereof. It is therefore possible to prevent permeation of water into the heating element surface without fail, and to reduce heat resistance between the water bearing layer and the heating element.

Since the waterproof layer has a thermally conductive paint film formed by coating a thermally conductive resin onto the surface of the electric insulating paint film, heat resistance between the water bearing layer and the heating element can be reduced.

Since the aforementioned waterproof layer has a metal film formed on the surface thereof, it is possible to prevent permeation of water into the heating element surface without fail, and reduce thermal resistance between the water-bearing layer and the heating element.

The aforementioned dehumidifying means comprises a water-vapor exchange module constricted by forming a hydrogen ion conductive solid electrolytic element into a three-dimensional shape, the solid electrolytic element having a configuration in which electrodes are provided on the both surfaces of a solid polyelectrolytic membrane, respectively, and catalyst layers are provided also on the both surfaces of the solid polyelectrolytic membrane, respectively, to form electrolytic reaction surfaces, and the water-vapor exchange module being arranged so that air flowed along the surface of the water-bearing layer flows along one of the electrolyte reaction surfaces; a water condenser arranged on the other side of the electrolytic reaction surfaces of the water-vapor exchange module; and a DC power source supplying voltage to the solid electrolytic element via the electrodes so that the electrode on one side of the electrolytic reaction surfaces becomes an anode. The dehumidifying means is therefore applicable for cooling a small-sized heating element of a cooling load of up to several tens of W.

The aforementioned water vapor exchange module is arranged within a can-shaped member so as to form a first closed space facing the one side of the electrolytic reaction surfaces and a second closed space facing the other side of the electrolytic reaction surfaces; the water condenser is arranged in the second dosed space; and a partition member is arranged in the first closed space so as to form the closed spaces housing the heating element and the air circuit along one of the electrolytic reaction surfaces. It is therefore possible to inhibit penetration of heat into the closed spaces, and to improve the cooling efficiency.

Because the air cooler is arranged on the outlet side of the air circuit to said closed spaces so as to previously cool air flowing along the surface of the water-bearing layer, it is possible to further inhibit penetration of heat into the closed spaces, and to further improve the cooling efficiency.

What is claimed is:

1. A water vaporization type cooling apparatus of a heating element comprising:

a closed space sealing air therein and housing said heating element therein;

a water sump portion provided in said close space for storing water;

a waterproof layer formed on the surface of said heating element;

a water-bearing layer formed on the surface of said waterproof layer, an end of said water-bearing layer, when said heating element is housed in said closed space, being immersed in water stored in said water sump portion;

an air circuit connected the both ends thereof to said closed space, said air circuit forming a closed loop in which air is circulated in cooperation with said closed space;

air circulating means, provided in said air circuit, for causing air to flow along the surface of said water-bearing layer by circulating air in said closed loop;

dehumidifying means, arranged in said air circuit, for recovering through condensation and separation of water contained in air flowing along the surface of said water-bearing layer; and water returning means for returning water recovered by said dehumidifying means said water sump portion, wherein water impregnated in said water-bearing layer is vaporized by causing air to flow along the surface of said water-bearing layer so that said heating element is cooled by the latent heat of vaporization of water.

2. A water vaporization type cooling apparatus of a heating element according to claim 1, wherein said waterproof layer is an electrically insulating paint film formed by coating an insulating resin not having water permeability onto the surface of said heating element.

3. A water vaporization type cooling apparatus of a heating element according to claim 2, wherein said waterproof layer has a metallic film formed on the surface thereof.

4. A water vaporization type cooling apparatus of a heating element according to claim 2, wherein said waterproof layer has a thermally conductive paint film formed by coating a thermally conductive resin onto the surface of said electrically insulating paint film.

5. A water vaporization type cooling apparatus of a heating element according to claim 4, wherein said waterproof layer has a metallic film formed on the surface thereof.

6. A water vaporization type cooling apparatus of a heating element according to claim 1, wherein said dehumidifying means comprises a water-vapor exchange module constricted by forming a hydrogen ion conductive solid electrolytic element into a three-dimensional shape, said solid electrolytic element having a configuration in which electrodes are provided on the both surfaces of a solid polyelectrolytic membrane, respectively, and catalyst layers are provided also on the both surfaces of said solid polyelectrolytic membrane, respectively, to form electrolytic reaction surfaces, and said water-vapor exchange module being arranged so that air flowed along the surface of said water-bearing layer flows along one of the electrolyte reaction surfaces; a water condenser arranged on the other side of the electrolytic reaction surfaces of said water-vapor exchange module; and a DC power source supplying voltage to said solid electrolytic element via said electrodes so that the electrode on one side of the electrolytic reaction surfaces becomes an anode.

7. A water vaporization type cooling apparatus of a heating element according to claim 6, wherein said water-vapor exchange module is arranged within a can-shaped member so as to form a first closed space facing said one side of the electrolytic reaction surfaces and a second closed space facing said other side of the electrolytic reaction surfaces; said water condenser is arranged in said second closed space; and a partition member is arranged in said first closed space so as to form said closed spaces housing said heating element and said air circuit along one of said electrolytic reaction surfaces.

8. A water vaporization type cooling apparatus of a heating element according to claim 7, wherein an air cooler is arranged on the outlet side of said air circuit to said closed spaces so as to previously cool air flowing along the surface of said water-bearing layer.

* * * * *